(12) United States Patent
Yoshida et al.

(10) Patent No.: US 10,204,886 B2
(45) Date of Patent: Feb. 12, 2019

(54) SEMICONDUCTOR DEVICE

(71) Applicant: Mitsubishi Electric Corporation, Tokyo (JP)

(72) Inventors: Hiroshi Yoshida, Tokyo (JP); Yuji Imoto, Tokyo (JP); Hidetoshi Ishibashi, Tokyo (JP); Daisuke Murata, Tokyo (JP); Kenta Nakahara, Tokyo (JP); Seiji Oka, Tokyo (JP); Junji Fujino, Tokyo (JP); Nobuhiro Asaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/766,903

(22) PCT Filed: Jan. 29, 2016

(86) PCT No.: PCT/JP2016/052695
§ 371 (c)(1),
(2) Date: Apr. 9, 2018

(87) PCT Pub. No.: WO2017/130381
PCT Pub. Date: Aug. 3, 2017

(65) Prior Publication Data
US 2018/0294253 A1   Oct. 11, 2018

(51) Int. Cl.
*H01L 25/07*   (2006.01)
*H01L 25/18*   (2006.01)
(Continued)

(52) U.S. Cl.
CPC ........... *H01L 25/072* (2013.01); *B32B 27/38* (2013.01); *C09D 163/00* (2013.01); *H01L 23/4924* (2013.01); *H01L 25/18* (2013.01)

(58) Field of Classification Search
CPC ....... H01L 25/072; H01L 25/18; B32B 27/38; C09D 163/00
See application file for complete search history.

(56) References Cited

U.S. PATENT DOCUMENTS

2008/0054425 A1* 3/2008 Malhan ................... H01L 24/72
  257/678
2009/0246910 A1* 10/2009 Taniguchi ........... H01L 23/5385
  438/107

FOREIGN PATENT DOCUMENTS

JP   2009-224550 A   10/2009
JP   2015-162649 A    9/2015

OTHER PUBLICATIONS

International Search Report issued in PCT/JP2016/052695; dated Mar. 22, 2016.
(Continued)

*Primary Examiner* — Peniel M Gumedzoe
(74) *Attorney, Agent, or Firm* — Studebaker & Brackett PC

(57) ABSTRACT

A semiconductor device includes semiconductor chips fixed to a board, an insulating plate having a through-hole formed therein, a first lower conductor including a lower main body formed on the lower surface of the insulating plate and soldered to any of the semiconductor chips, and a lower protrusion portion that connects with the lower main body, and extends to the outside of the insulating plate, a second lower conductor formed on a lower surface of the insulating plate and soldered to any of the semiconductor chips, an upper conductor including an upper main body formed on the upper surface of the insulating plate, and an upper protrusion portion that connects with the upper main body and extends to the outside of the insulating plate, and a
(Continued)

connection portion provided in the through-hole and connects the upper main body and the second lower conductor.

16 Claims, 9 Drawing Sheets

(51) Int. Cl.
    *H01L 23/492*     (2006.01)
    *C09D 163/00*     (2006.01)
    *B32B 27/38*     (2006.01)

(56) References Cited

OTHER PUBLICATIONS

Notification of Transmittal of Translation of the International Preliminary Report on Patentability issued in PCT/JP2016/052695; dated Aug. 9, 2018.

\* cited by examiner

SEMICONDUCTOR DEVICE

FIELD

The present invention relates to a semiconductor device used, for example for control of a large current.

BACKGROUND

There is a semiconductor device that has, for example, an IGBT (Insulated Gate Bipolar Transistor) or the like mounted therein and is used for control of a large current. When a wiring material such as an aluminum wire is used for internal wiring in the semiconductor device as described above, joint reliability to power cycle or the like cannot be sufficiently secured.

Patent Literature 1 discloses that an element is soldered to a board and a lead terminal is directly soldered to the element. This lead terminal is an external electrode extending to the outside of the device.

PRIOR ART

Patent Literature

Patent literature 1: Japanese Patent Laid-Open No. 2015-162649 A

SUMMARY

Technical Problem

The external electrode, which is an electrode exposed to the outside of the semiconductor device, is often formed by punching a single metal plate with a die or the like. When such an external electrode is soldered to a semiconductor chip, various troubles occur. For example, plural external electrodes joined to the semiconductor chip constitute a two-dimensional wiring, so that the degree of freedom of wiring decreases and the outer size of the semiconductor chip increases.

Furthermore, when the plural external electrodes are soldered to the semiconductor chip at the same time, it is difficult to make the plural external electrodes even in height. When the plural external electrodes are uneven in height, the solder thickness becomes irregular, so that a large margin must be set for the solder thickness.

Furthermore, when the same electrode is applied to an external electrode connected to a signal circuit portion through which a small current flows, and an external electrode connected to a main circuit portion through which a large current flows, the external electrode connected to the signal circuit portion is over-engineered from the viewpoint of current capacity. In this case, a useless cost occurs in addition to an increase in the outer size of the semiconductor device.

Furthermore, in order to secure some degree of strength, the external electrode is formed to be relatively thick. It is not easy to solder such an external electrode to a narrow area site such as a signal pad of the semiconductor chip with high precision. Therefore, there is a problem that the size of the semiconductor chip must be set to be large in order to increase the area of the signal pad.

Furthermore, stress acting on the external electrode when a case is deformed or solder is joined directly acts on solder in contact with the semiconductor chip. It is necessary to shorten the length of the external electrode so that large force does not act on the solder.

The present invention has been made to solve the foregoing problem, and has an object to provide a semiconductor device capable of preventing troubles occurring due to soldering of an external electrode to a semiconductor chip.

Means for Solving the Problems

According to a present invention, a semiconductor device includes a board, a plurality of semiconductor chips fixed to the board, an insulating plate having a through-hole formed therein, a first lower conductor including a lower main body that is formed on a lower surface of the insulating plate and soldered to any of the plurality of semiconductor chips, and a lower protrusion portion that connects with the lower main body, and extends to an outside of the insulating plate in plan view, a second lower conductor that is formed on a lower surface of the insulating plate and soldered to any of the plurality of semiconductor chips, an upper conductor including an upper main body formed on an upper surface of the insulating plate, and an upper protrusion portion that connects with the upper main body and extends to an outside of the insulating plate in plan view, a connection portion that is provided in the through-hole and connects the upper main body and the second lower conductor to each other, a first external electrode connected to the lower protrusion portion, and a second external electrode connected to the upper protrusion portion.

Other features of the present invention will become apparent from the following description.

Advantageous Effects of the Invention

According to the present invention, three-dimensional wiring can be performed by a relay board provided on a semiconductor chip, so that troubles occurring due to soldering of an external electrode to the semiconductor chip can be prevented.

DESCRIPTION OF EMBODIMENTS

A semiconductor device according to an embodiment of the present invention will be described with reference to the drawings. The same or corresponding constituent elements are represented by the same reference signs, and the duplicative descriptions thereof may be omitted.

First Embodiment

Figure 1:
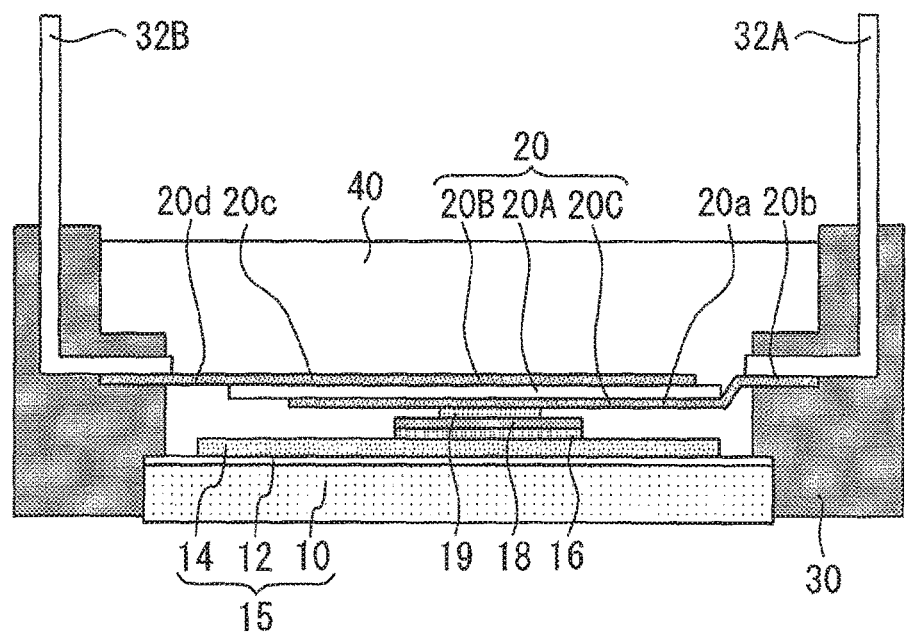
FIG. 1 is a cross-sectional view showing a semiconductor device according to a first embodiment.

FIG. 1 is a cross-sectional view showing a semiconductor device according to a first embodiment of the present invention. The semiconductor device has a board 15. The board 15 includes a base plate 10 formed of metal, an insulating board 12 provided on the base plate 10 and a circuit pattern 14 formed on the surface of the insulating board 12. Heat radiation grease may be provided between the base plate 10 and the insulating board 12. The board 15 and a semiconductor chip 18 are fixed to each other by solder 16. The back surface of the semiconductor chip 18 is soldered to the circuit pattern 14. A plurality of semiconductor chips 18 are provided.

Although not specifically limited, the semiconductor chip 18 may be a transistor chip such as an IGBT and a diode chip, for example. When an inverter circuit of three phases is configured by a semiconductor device, six transistor chips and six diodes which are reversely connected to the six transistor chips are provided.

A relay board 20 is provided on the semiconductor chip 18. The relay board 20 includes an insulating plate 20A, an upper conductor 20B formed on the upper surface side of the insulating plate 20A, and a first lower conductor 20C formed on the lower surface side of the insulating plate 20A. The material of the insulating plate 20A is glass epoxy, for example.

The first lower conductor 20C has a lower main body 20a and a lower protrusion portion 20b. The lower main body 20a is formed on the lower surface of the insulating plate 20A. The upper surface of the semiconductor chip 18 is soldered to the lower main body 20a with solder 19. The lower protrusion portion 20b connects with the lower main body 20a, and extends to the outside of the insulating plate 20A in plan view. The first lower conductor 20C is formed of a conductor. The thickness of the first lower conductor 20C is not less than 0.2 mm, for example.

The upper conductor 20B has an upper main body 20c and an upper protrusion portion 20d. The upper main body 20c is formed on the upper surface of the insulating plate 20A. The upper protrusion portion 20d connects with the upper main body 20c, and extends to the outside of the insulating plate 20A in plan view. The upper conductor 20B is formed of a conductor. The thickness of the upper conductor 20B is not less than 0.2 mm, for example.

A first external electrode 32A is connected to the lower protrusion portion 20b via solder. A second external electrode 32B is connected to the upper protrusion portion 20d via solder. A part of the first external electrode 32A and a part of the second external electrode 32B are inserted in a case 30. The case 30 surrounds the semiconductor chip 18. Resin 40 is filled in the case 30. The resin 40 is epoxy resin, for example.

Figure 2:
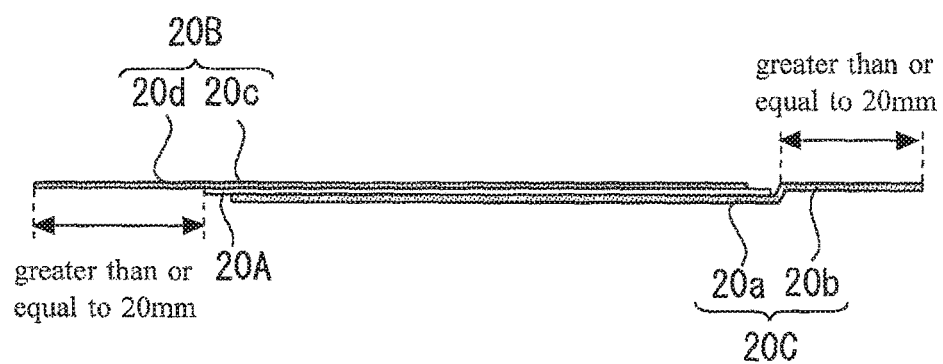
FIG. 2 is a cross-sectional view of the relay board.

FIG. 2 is a cross-sectional view of the relay board 20. In order to secure a sufficient joint area between the lower protrusion portion 20b and the first external electrode 32A, it is preferable that the lower protrusion portion 20b protrudes from the insulating plate 20A by 20 mm or more in plan view. In order to secure a sufficient joint area between the upper protrusion portion 20d and the second external electrode 32B, it is preferable that the upper protrusion portion 20d protrudes from the insulating plate 20A by 20 mm or more in plan view.

By bending the lower protrusion portion 20b, the height at the connection position between the lower protrusion portion 20b and the first external electrode 32A is made coincident with the height at the connection position between the upper protrusion portion 20d and the second external electrode 32B. By configuring the first lower conductor 20C in a flat shape having no bended portion and bending the upper protrusion portion 20d, the height at the connection position between the lower protrusion portion 20b and the first external electrode 32A may be made coincident with the height at the connection position between the upper protrusion portion 20d and the second external electrode 32B.

Figure 3:
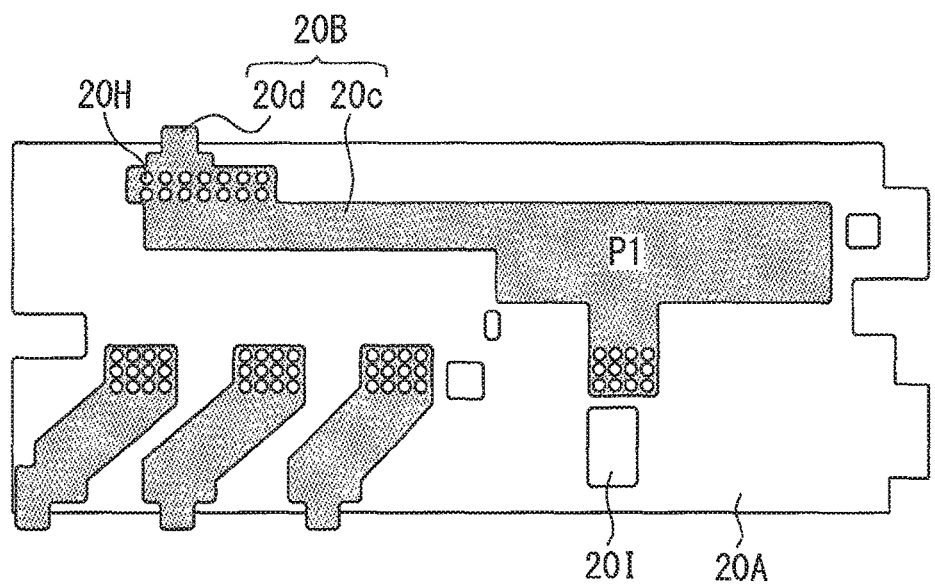
FIG. 3 is a plan view of the relay board.

FIG. 3 is a plan view of the relay board 20. In FIG. 3, the conductor formed on the lower surface side of the insulating plate 20A is omitted. "P1" described on the upper conductor 20B indicates that the upper conductor 20B is used as a P-phase pattern. The upper protrusion portion 20d which is a part of the upper conductor 20B protrudes to the outside of the outer periphery of the insulating plate 20A. A plurality of upper conductors 20B are formed. Through holes 20H are formed at portions of the insulating plate 20A where the upper conductor 20B is present. Filling holes 20I are provided at portions of the insulating plate 20A where the upper conductor 20B is absent. The filling holes 20I are filled with resin 40.

Figure 4:
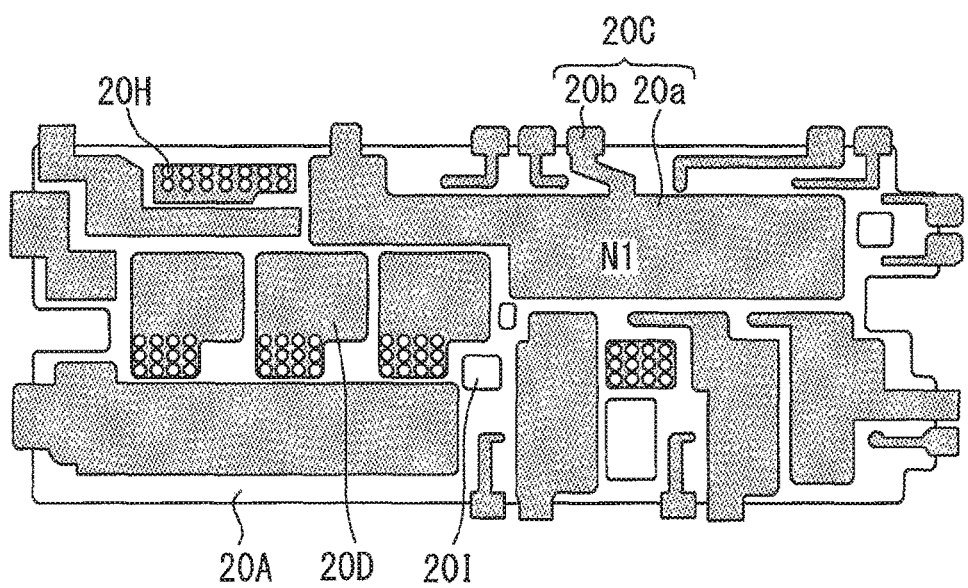
FIG. 4 is a bottom view of the relay board.

FIG. 4 is a bottom view of the relay board 20. In FIG. 4, the conductor formed on the upper surface side of the insulating plate 20A is omitted. "N1" described on the first lower conductor 20C indicates that the first lower conductor 20C is used as an N-phase pattern. The lower protrusion portion 20b which is a part of the first lower conductor 20C protrudes to the outside of the outer periphery of the insulating plate 20A. A plurality of first lower conductors 20C are formed. In addition to the first lower conductor 20C, a second lower conductor 20D is formed on the lower surface of the insulating plate 20A. The second lower conductor 20D does not have a protrusion portion protruding to the outside of the outer periphery of the insulating plate 20A in plan view. The second lower conductor 20D is soldered to the semiconductor chip 18 shown in FIG. 1 or a semiconductor chip soldered to the board 15 although not shown in FIG. 1.

A plurality of second lower conductors 20D are provided. For example, the emitter electrode or the base electrode of the transistor chip or the anode electrode of the diode chip is soldered to the plurality of first lower conductors 20C and the plurality of second lower conductors 20D.

Figure 5:
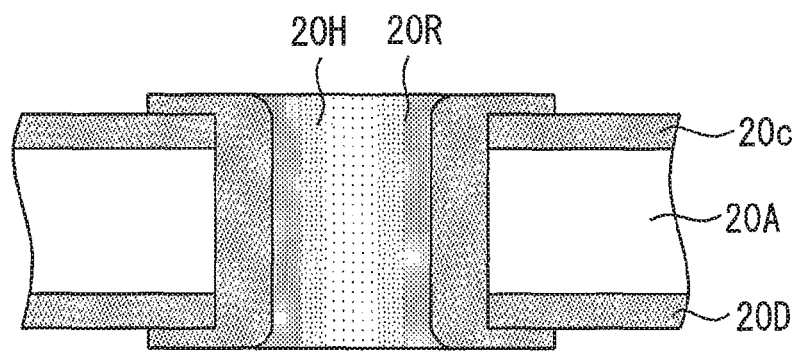
FIG. 5 is a cross-sectional view of a portion in the neighborhood of the through hole.

Through holes 20H are formed at portions of the insulating plate 20A where the second lower conductors 20D are present. FIG. 5 is a cross-sectional view of a portion in the neighborhood of the through hole 20H. A connection portion 20R for connecting the upper main body 20c and the second lower conductor 20D is provided in the through hole 20H. The connection portion 20R is not limited to a specific one insofar as it electrically connects the upper main body 20c and the second lower conductor 20D. For example, it is a copper-plated layer. However, when a copper-plated layer having a thickness of about 15 to 75 μm is formed, in order to deal with a large current, it is necessary to provide a large number of through holes in which the copper-plated layer has been formed. For example, a current of 10 A is made to flow in the copper-plated layer which is formed to have a thickness of 50 μm in a through hole 20H.

In order to avoid provision of a large number of through holes 20H, it is preferable to form the connection portion 20R by performing pressure-welding on a metal member. In this case, the connection portion 20R is formed by pressurizing and deforming eyelets to crimp the eyelets. In this case, a large current can be made to flow with a smaller number of through holes 20H as compared with a case where the connection portion 20R is formed by plating.

Figure 6:
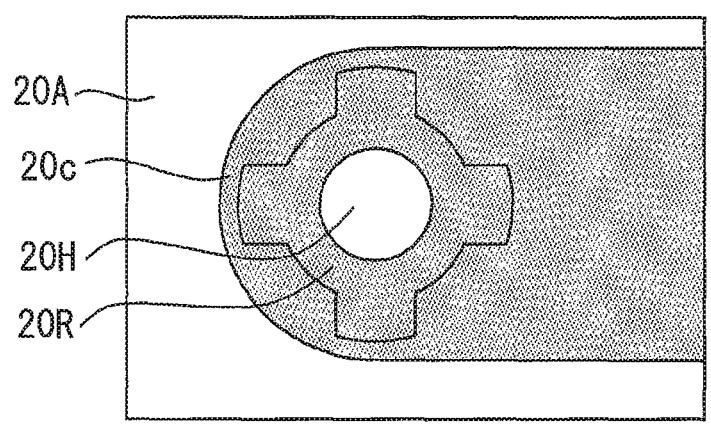
FIG. 6 is a plan view of the connection portion.
Figure 7:
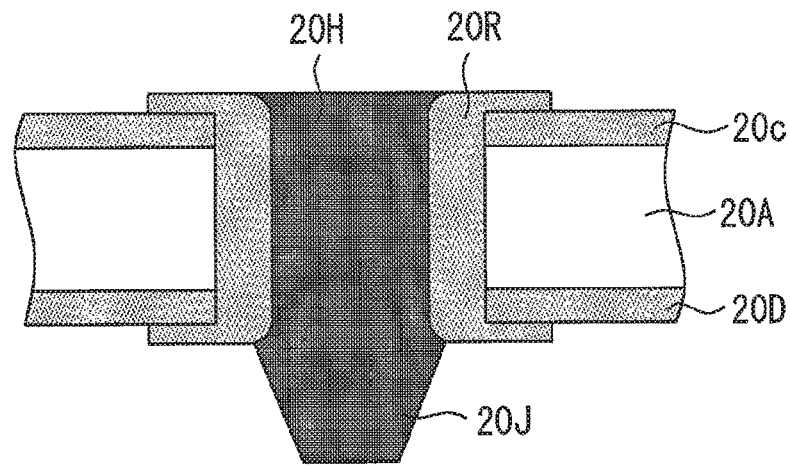
FIG. 7 is a cross-sectional view of the periphery of the through hole.

FIG. 6 is a plan view of the connection portion 20R. The connection portion 20R is preferably formed by pressurizing and deforming the eyelet as described above. The metal member constituting the connection portion 20R as described above is not filled in the through hole 20H. In order to further enhance the current capacity, the through hole 20H is filled with metal. FIG. 7 is a cross-sectional view of the periphery of the through hole 20H and shows that the through hole 20H is filled with filling metal 20J. The filling metal 20J is in contact with the connection portion 20R, and is filled up in the through hole 20H. The filling metal 20J is formed by pouring metal such as solder material into the through hole 20H, for example.

It is preferable that the filling metal 20J protrudes in a direction toward the semiconductor chip 18. When the second lower conductor 20D is brought into electrical contact with a portion having a small area such as a signal pad of the semiconductor chip 18, the protruding filling metal 20J is positioned to a positioning reference, whereby position aberration can be prevented.

Figure 8:
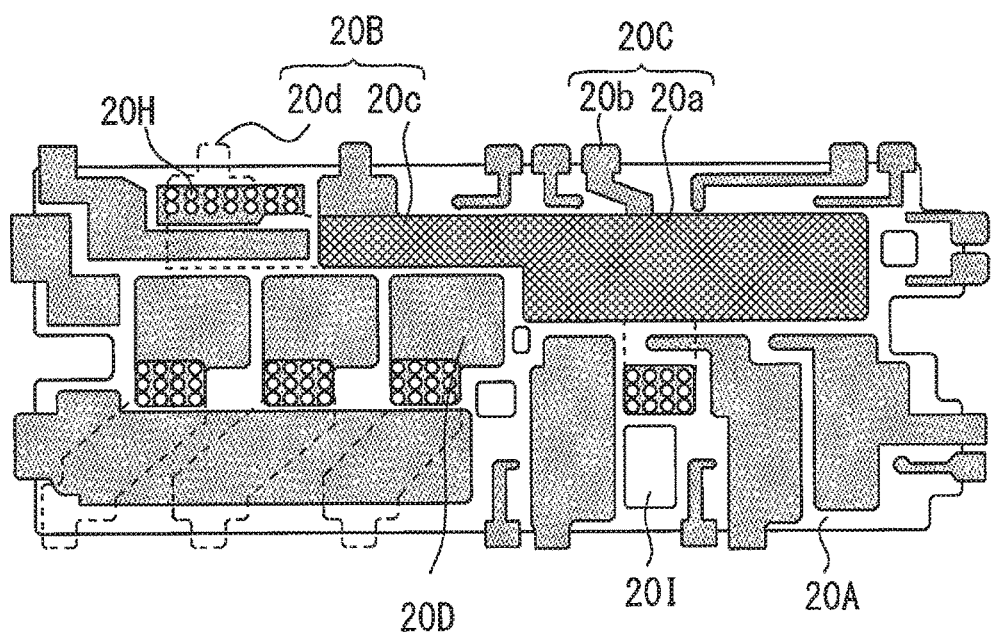
FIG. 8 is a diagram obtained by adding the bottom view of the relay board with the outline of the upper conductor.

FIG. 8 is a diagram obtained by adding the bottom view of the relay board 20 with the outline of the upper conductor 20B. The outline of the upper conductor 20B is represented by a broken line. An area represented by orthogonal oblique lines is an area where the lower main body 20a and the upper main body 20c overlap each other in plan view. When a transistor chip is provided as the semiconductor chip 18, a collector current of the transistor chip is made to flow in one of the lower main body 20a and the upper main body 20c, and an emitter current of the transistor chip is made to flow in the other main body. The collector current and the emitter current are made to flow in opposite directions in plan view at the portion where the lower main body 20a and the upper main body 20c overlap each other in plan view, whereby the internal inductance of the semiconductor device can be reduced.

Figure 9:
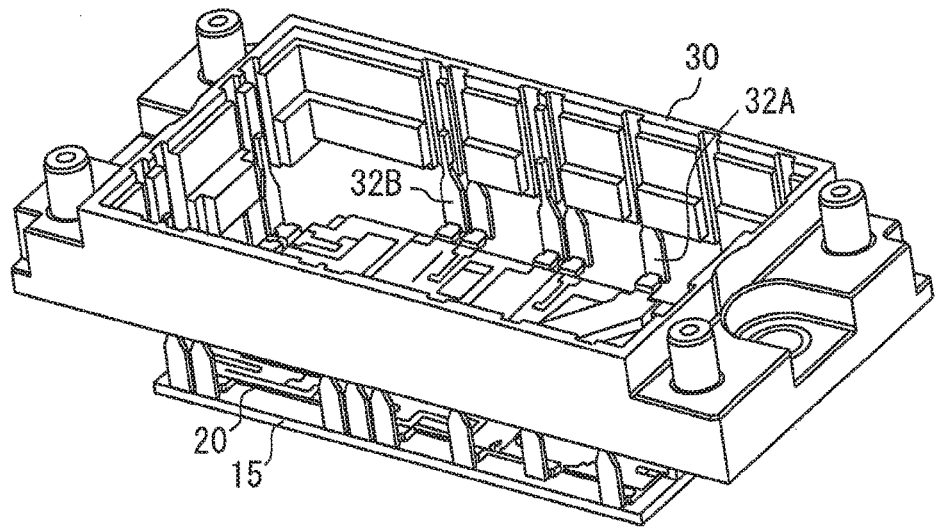
FIG. 9 is a perspective view of a case, etc. which shows a method of fabricating a semifinished product.

FIG. 9 is a perspective view of a case, etc. which shows a method of fabricating a semifinished product. The semifinished product is completed by fixing the semiconductor chip 18 to the board 15, fixing the relay board 20 to the semiconductor chip 18, and fixing the external electrodes such as the first external electrode 32A, the second external electrode 32B, etc. to the relay board 20. The external electrodes may be connected to the relay board 20 in another step subsequent to unification of the board 15, the semiconductor chip 18 and the relay board 20 into one body, or the board 15, the semiconductor chip 18, the relay board 20 and the external electrodes may be unified into one body in a lump. The latter has a lower fabrication cost.

The case 30 is fitted to the semifinished product by approaching the case 30 from the upper side of the semifinished product and sliding the external electrodes such as the first external electrode 32A, the second external electrode 32B, etc. along the groove of the case 30. Thereafter, the resin 40 is poured into the case 30 to complete the semiconductor device of FIG. 1. In order to secure the insulation performance of the semiconductor device, it is necessary to fully fill the resin 40 in the case 30.

However, for example when the insulating plate 20A is large and little gap exists between the relay board 20 and the case 30, it is difficult to pour the resin to the lower side of the relay board 20 due to the presence of the relay board 20. Therefore, in the first embodiment of the present invention, the insulating plate 20A is provided with the filling holes 20I, whereby the resin easily flows from the upper side of the relay board 20 to the lower side of the relay board 20 via these holes. In order to smoothly supply the resin 40 to the lower side of the relay board 20, it is desirable that the widths of the filling holes 20I are set to be three times or more as large as the thickness of the insulating plate 20A.

Figure 10:
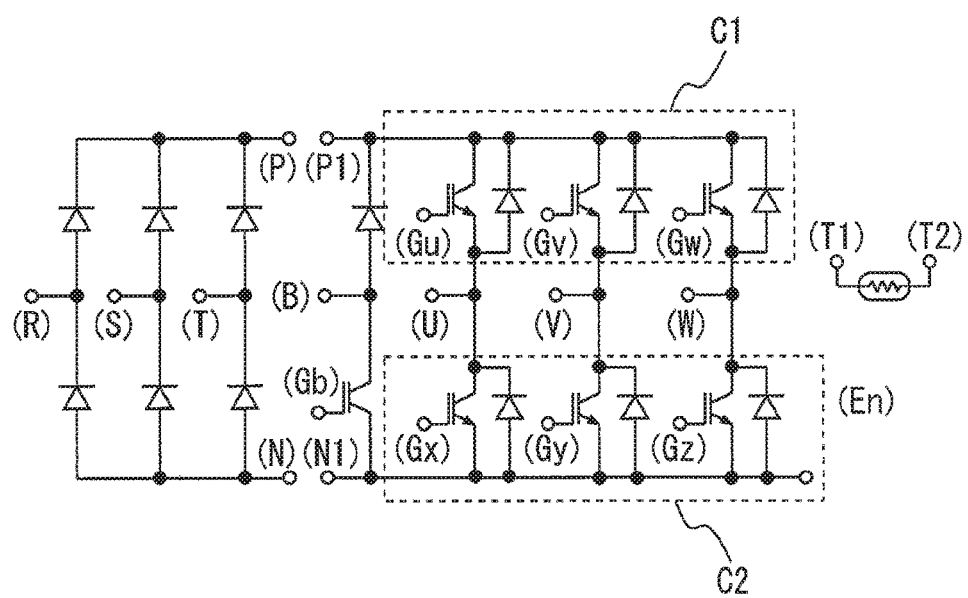
FIG. 10 is a circuit diagram showing the semiconductor device of the first embodiment.

FIG. 10 is a circuit diagram showing the semiconductor device of the first embodiment of the present invention. The chips such as the transistor chip and the diode chip are provided as the plurality of semiconductor chips 18 to form a converter circuit, an inverter circuit and a brake circuit. The inverter circuit has a P-phase circuit portion C1 and an N-phase circuit portion C2.

Figure 11:
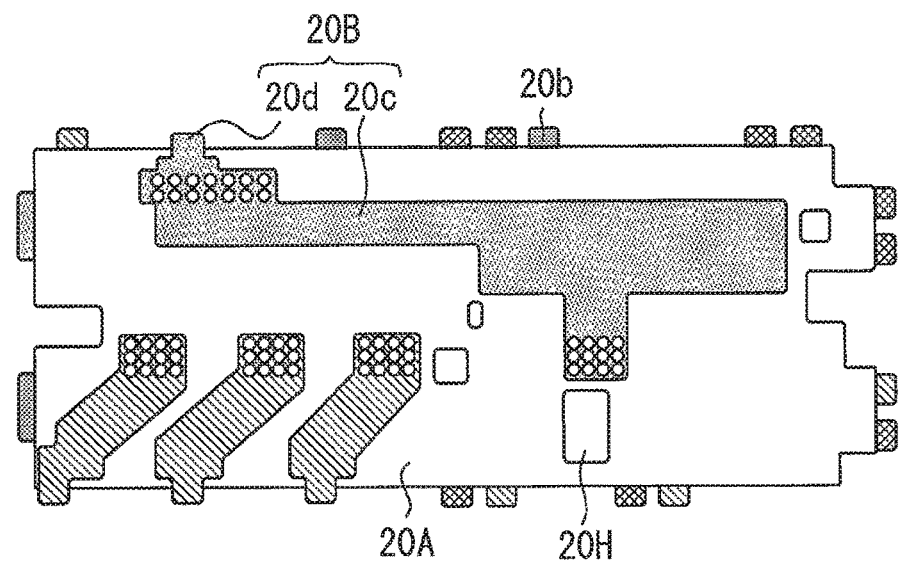
FIG. 11 is a plan view of the relay board.

FIG. 11 is a plan view of the relay board 20. As described above, the upper protrusion portion 20d and the lower protrusion portion 20b protrude to the outside of the insulating plate 20A in plan view. These protrusion portions protrude in up-and-down and right-and-left directions of the insulating plate 20A.

In the semiconductor device according to the first embodiment I of the present invention, the conductors are formed on the upper and lower surfaces of the relay board 20, so that three-dimensional wiring can be performed by those conductors. Accordingly, as compared with a case where the external electrodes are directly fixed to the semiconductor chip, restriction on the wiring is less, so that the outer size of the semiconductor device can be reduced.

The semiconductor device according to the first embodiment of the present invention has the upper protrusion portion 20d and the lower protrusion portion 20b extending to the outside of the insulating plate 20A in plan view. Since the second external electrode 32B is soldered to the upper protrusion portion 20d and the first external electrode 32A is soldered to the lower protrusion portion 20b, the soldering can be easily performed. All the external electrodes are located on the outside of the insulating plate 20A in plan view, so that it is easy to fit the case 30 to the semifinished product.

Furthermore, the height at the connection position between the lower protrusion portion 20b and the first external electrode 32A and the height at the connection position between the upper protrusion portion 20d and the second external electrode 32B are made coincident with each other by bending the lower protrusion portion 20b or the upper protrusion portion 20d. As a result, the shapes of the external electrodes are made common. For example, the heights of the external electrodes can be unified. Since the external electrode can be easily soldered to the protrusion portion of the conductor, it is also possible to solder the plural external electrodes to the protrusion portions in a lump.

When the plural semiconductor chips 18 are uneven in thickness, it is required to thickly form the solder 19 between a thin semiconductor chip and the relay board 20 and thinly form the solder 19 between a thick semiconductor chip and the relay board 20. That is, it is difficult to realize a proper solder thickness. Therefore, the thickness of the first lower conductor 20C or the second lower conductor 20D may be made uneven so that the thickness of the solder 19 is proper. In this case, the plural solders for joining the relay board 20 and the plural semiconductor chips 18 can be made uniform in thickness.

With respect to the conductors and the external electrodes of the relay board 20, it is preferable to use materials which are different between the signal circuit portion in which a small current flows and the main circuit portion in which a large current of several tens amperes or more flows. For example, the conductors and the external electrodes for signals may be formed of a brass-based material, and the conductors and the external electrodes for the main circuit may be formed of a native-copper-based material. When plural pairs of first lower conductors 20C and first external electrodes 32A are provided, the plural first external electrodes 32A are formed of different materials. As a result, as compared with the case where all of the conductors and the external electrodes are formed of the native-copper-based material, the material cost can be reduced. The first external electrode 32A and the second external electrode 32B may be formed of different materials.

In the first embodiment, the lower main body 20a or the second lower conductor 20D is electrically connected to the collector or emitter of the transistor chip. A portion where a main current flows should be formed of a material having high electrical conductivity such as native-copper-based material, for example. Alternatively, with respect to the conductors formed on the insulating plate 20A, the conductors for signals are thinly formed, and the conductors for the main circuit are thickly formed.

Soldering or pressure-welding connection such as press-fitting is known as a method of connecting an external electrode and an external device. The shape and material of the external electrodes may be selected according to each connection method. Since the external electrode and the relay board 20 are different parts, the shape and material of the external electrodes can be freely selected without considering the joint to the semiconductor chip, etc. When some degree of strength is required to the external electrodes, the first external electrode 32A is configured to be thicker than the first lower conductor 20C, and the second external electrode 32B is configured to be thicker than the upper conductor 20B.

The P-phase circuit portion is provided on the upper surface side of the relay board and the N-phase circuit portion is provided on the lower surface side of the relay board, whereby the P-phase and the N-phase can be provided in parallel as shown in FIG. 5. As a result, the inductance can be reduced. Furthermore, by excluding wire connection in the semiconductor device, the inductance in the package can be further reduced.

Various modifications may be performed on the semiconductor device according to the first embodiment of the present invention within a range where the features thereof are not lost. Various modifications may be performed on the relay board 20 insofar as they realize the three-dimensional wiring. For example, a conductor having a hierarchical structure of three or more layers may be presented in the relay board to enhance the degree of freedom of wiring. In this case, a new insulating plate is provided on the upper conductor 20B, and a conductor is provided on the insulating plate to thereby present a conductor having a hierarchical structure of three layers.

The resin 40 covers the insulating plate 20A, the first lower conductor 20C, the second lower conductor 20D, the upper conductor 20B and the plural semiconductor chips 18, and exposes parts of the first external electrode 32A and the second external electrode 32B to the outside. The filling holes 20I are provided so that the resin 40 surely covers the semiconductor chip 18. However, when there is a sufficient space between the relay board 20 and the inner wall of the case 30, the filling holes 20I may be omitted.

The circuit configured by the plural semiconductor chips 18 is not limited to the circuit of FIG. 10. For example, a half bridge circuit may be configured. The method of connecting the external electrode and the relay board is not limited to soldering, and for example, an ultrasonic joint method may be adopted.

Figure 12:
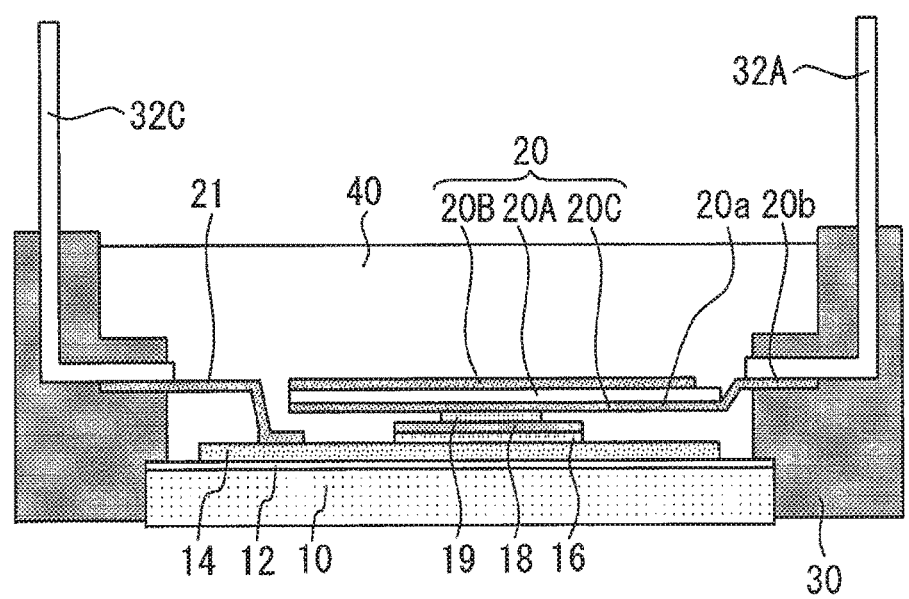
FIG. 12 is a cross-sectional view of the semiconductor device according to a modification.

FIG. 12 is a cross-sectional view of the semiconductor device according to a modification. The semiconductor chip 18 is an IGBT, and has an emitter and a base on the upper surface thereof and a collector on the lower surface thereof. The collector is connected to a circuit pattern 14 by solder 16. A conductor 21 is fixed to the circuit pattern 14. The conductor 21 is connected to a third external electrode 32C. The height at the connection position between the conductor 21 and the third external electrode 32C is equal to the height at the connection position between the lower protrusion portion 20b and the first external electrode 32A and the height at the connection position between the upper protrusion portion 20d and the second external electrode 32B. The semiconductor chip is not limited to a vertical device in which a current flows between the upper and lower surfaces thereof, and it may be a horizontal device in which a current flows between two points on the upper surface of the chip.

These modifications may be appropriately applied to semiconductor devices according to the following embodiments. The semiconductor devices according to the following embodiments have many common points to the semiconductor device according to the first embodiment, and thus the different points from the first embodiment will be mainly described.

Second Embodiment

Figure 13:
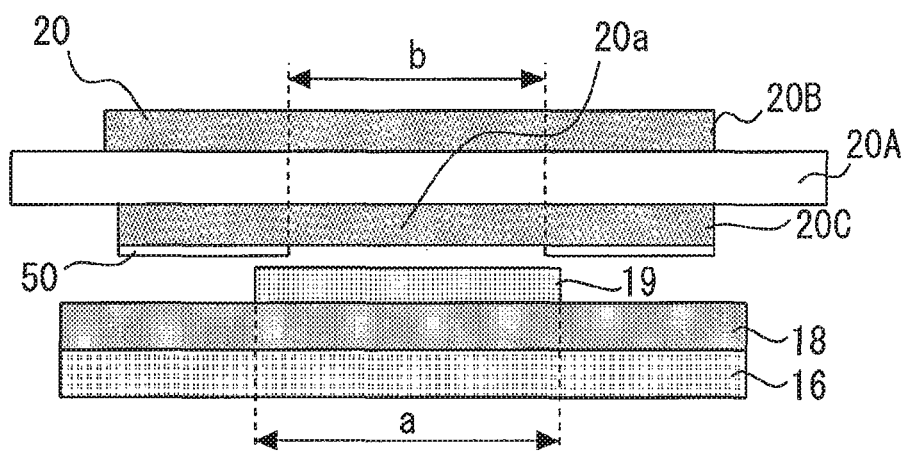
FIG. 13 illustrates a solder bonding of second embodiment.

FIG. 13 illustrates a state before the relay board 20 and the board 15 are joined to each other. A non-joint portion 50 to which no solder is joined is formed below the first lower conductor 20C. The non-joint portion 50 is formed of solder resist or polyimide, for example. The width b of the first lower conductor 20C exposed from the non-joint portion 50 is smaller than the width a of the solder 19.

Figure 14:
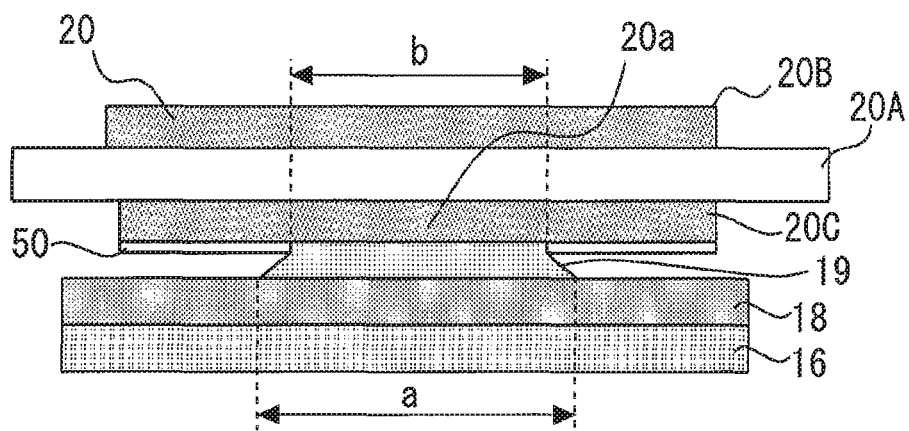
FIG. 14 shows the shape of the solder.

FIG. 14 is a diagram showing that the semiconductor chip 18 and the lower main body 20a of the first lower conductor 20C are joined to each other by the solder 19. With respect to the solder 19 for joining the semiconductor chip 18 and the lower main body 20a, the contact area of the solder 19 with the semiconductor chip 18 is larger than the contact area of the solder 19 with the lower main body 20a. As a result, the fillet-shape of the solder 19 makes an acute angle with the upper surface of the semiconductor chip 18. Accordingly, as compared with a case where such an acute angle is not realized, stress acting on the semiconductor chip 18 via the solder 19 can be reduced.

According to the same method as described above, it is preferable that the solder for joining the semiconductor chip 18 and the second lower conductor 20D is provided so that the contact area of the solder with the semiconductor chip 18 is larger than the contact area of the solder with the second lower conductor 20D.

Third Embodiment

Figure 15:
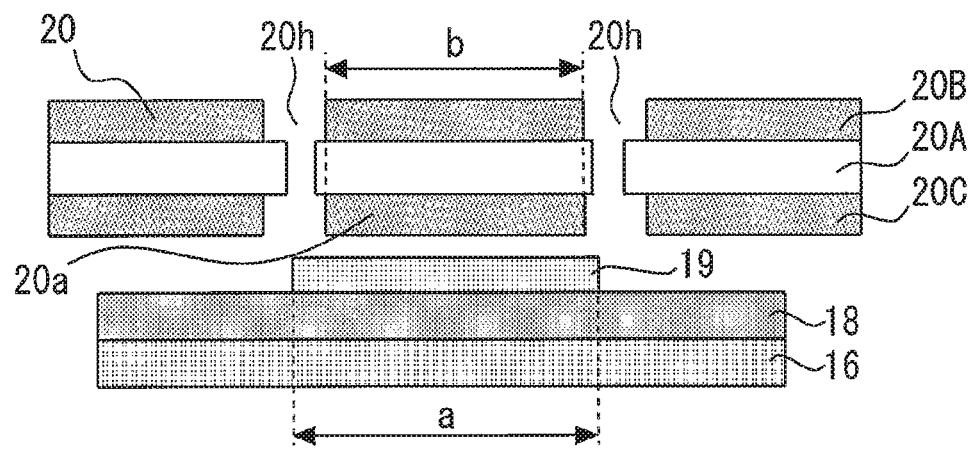
FIG. 15 illustrates a solder bonding of third embodiment.

FIG. 15 illustrates a state before the relay board 20 and the board 15 are joined to each other. The solder 19 is provided to join the lower main body 20a and the semiconductor chip 18. The lower main body 20a, the insulating plate 20A and the upper conductor 20B are absent just above an outer peripheral portion which is a part of the solder 19. That is, an opening 20h is provided in the relay board 20. The width b of the first lower conductor 20C surrounded by the opening 20h is larger than the width a of the solder 19.

Figure 16:
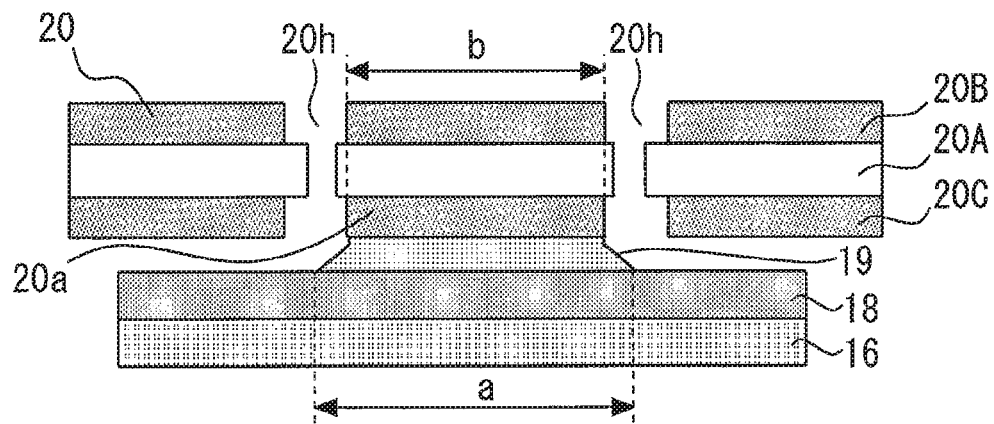
FIG. 16 shows the shape of the solder.

FIG. 16 is a diagram showing that the semiconductor chip 18 and the lower main body 20a of the first lower conductor 20C are joined to each other by the solder 19. With respect to the solder 19 for joining the semiconductor chip 18 and the lower main body 20a, the contact area of the solder 19 with the semiconductor chip 18 is larger than the contact area of the solder 19 with the lower main body 20a. As a result, the fillet-shape of the solder 19 makes an acute angle with the upper surface of the semiconductor chip 18. Accordingly, as compared with a case where such an acute angle is not realized, stress acting on the semiconductor chip 18 via the solder 19 can be reduced.

By providing the opening 20h, the semiconductor chip 18 and the lower main body 20a can be surely joined to each other by the solder 19. This effect is useful particularly when the soldering area is small. Furthermore, the opening 20h also functions as a reservoir for extra solder. As a result, the joint reliability can be enhanced.

When the semiconductor chip 18 and the second lower conductor 20D are soldered to each other, it is preferable to incorporate the foregoing feature. That is, an opening in which the second lower conductor 20D, the insulating plate 20A and the upper conductor 20B are absence is formed just above a part of the solder for joining the semiconductor chip 18 and the second lower conductor 20D.

Fourth Embodiment

Figure 17:
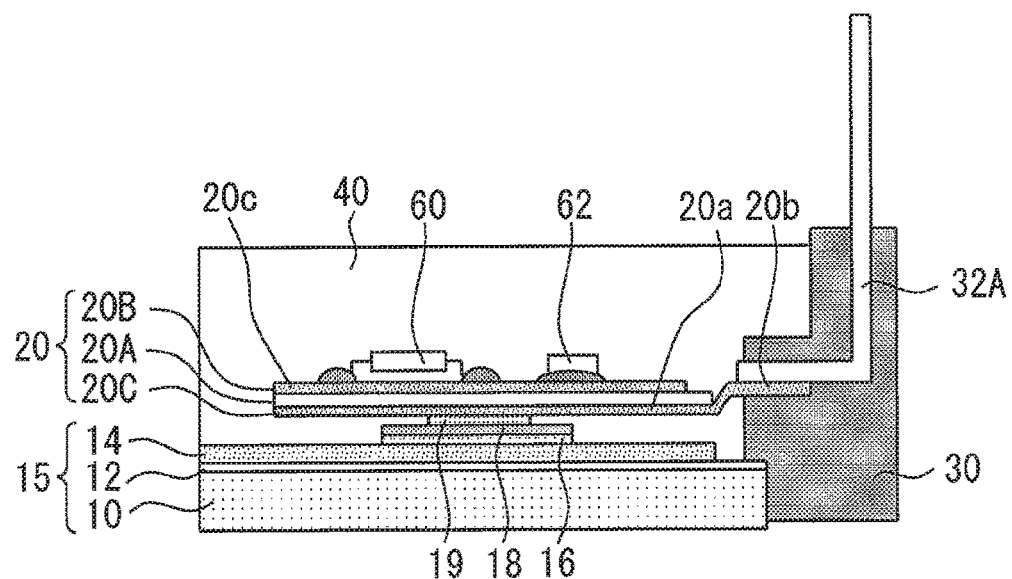
FIG. 17 is a cross-sectional view showing a semiconductor device according to a fourth embodiment.

FIG. 17 is a cross-sectional view showing a semiconductor device according to a fourth embodiment. Active parts 60, 62 are electrically connected to the upper main body 20c of the relay board 20. The active parts 60, 62 are, for example, a resistor, a capacitor, control IC or the like. The active parts 60, 62 are responsible for protective role of the semiconductor chip 18 or the semiconductor device. Parts which have been hitherto provided at the outside of the semiconductor device are provided as the active parts 60, 62 on the relay board 20, whereby the function and reliability of the semiconductor device can be enhanced.

Fifth Embodiment

Figure 18:
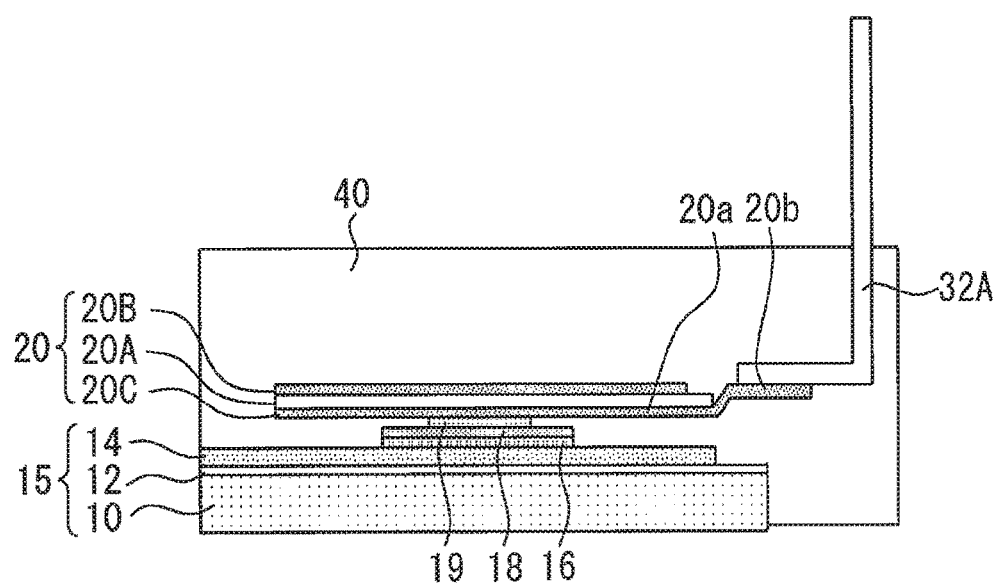
FIG. 18 is a cross-sectional view of a semiconductor device according to a fifth embodiment.

FIG. 18 is a cross-sectional view of a semiconductor device according to a fifth embodiment. The semiconductor device is formed by sealing a semifinished product with the resin 40 without any case, the semifinished product being formed by fabricating the board 15, the semiconductor chip 18, the relay board 20 and the external electrodes in a lump. A mold is used as an outer frame for the sealing using the resin 40. The interval between the board 15 and the relay board 20 is substantially equal to the thickness of the semiconductor chip 18, and thus it is very narrow. The thickness of the semiconductor chip 18 is equal to 100 μm, for example.

It is necessary to fill the resin in the very narrow area between the board 15 and the relay board 20. Stress reducing agent or the like has been hitherto contained in liquid epoxy resin material. However, in this case, the resin viscosity increases, and workability of resin pouring is degraded. Therefore, the content of the stress reducing agent or the like has been reduced in some cases.

In the fifth embodiment of the present invention, the resin is poured into the mold at a low pouring pressure of about 10 to 15 MPa under a vacuum environment, whereby the resin can be filled into the very narrow area between the board 15 and the relay board 20. Even when resin containing stress reducing agent is adopted, the resin can be supplied to every corner of the mold by pouring the resin into the mold at a low pressure. Furthermore, by containing the stress reducing agent in the resin, stress occurring in the solder 19, the semiconductor chip 18, etc. can be reduced, and the reliability of the semiconductor device can be enhanced. By using the mold, the outer shape of the semiconductor device can be completed without any case, so that the cost can be reduced. When the semiconductor device is configured without any case, the resin 40 is exposed to the side surface of the semiconductor device.

The features of the semiconductor device according to the respective embodiments described above may be appropriately combined with one another to enhance the effect of the present invention.

DESCRIPTION OF SYMBOLS 15 board, 18 semiconductor chip, 20 relay board, 20A insulating plate, 20B upper conductor, 20C first lower conductor, 20D second lower conductor, 20H through hole, 20I filling holes, 20J filling metal, 20R connection portion, 20a lower main body, 20b lower protrusion portion, 20c upper main body, 20d upper protrusion portion, 20h opening, 30 case, 32A first external electrode, 32B second external electrode, 32C third external electrode, 40 resin, 60 active part

The invention claimed is:
1. A semiconductor device comprising:
   a board;
   a plurality of semiconductor chips fixed to the board;
   an insulating plate having a through-hole formed therein;
   a first lower conductor including a lower main body that is formed on a lower surface of the insulating plate and soldered to any of the plurality of semiconductor chips, and a lower protrusion portion that connects with the lower main body, and extends to an outside of the insulating plate in plan view;
   a second lower conductor that is formed on a lower surface of the insulating plate and soldered to any of the plurality of semiconductor chips;
   an upper conductor including an upper main body formed on an upper surface of the insulating plate, and an upper protrusion portion that connects with the upper main body and extends to an outside of the insulating plate in plan view;
   a connection portion that is provided in the through-hole and connects the upper main body and the second lower conductor to each other;
   a first external electrode connected to the lower protrusion portion; and a second external electrode connected to the upper protrusion portion.

2. The semiconductor device according to claim 1, wherein the plurality of semiconductor chips include a transistor chip, and the lower main body or the second lower conductor is electrically connected to a collector or emitter of the transistor chip.

3. The semiconductor device according to claim 1, wherein a height at a connection position between the lower protrusion and the first external electrode and a height at a connection position between the upper protrusion portion and the second external electrode are made coincident with each other by bending the lower protrusion portion or the upper protrusion portion.

4. The semiconductor device according to claim 1, wherein the plurality of semiconductor chips include a transistor chip, and the lower main body and the upper main body overlap each other in plan view, whereby a collector current and an emitter current of the transistor chip flow in opposite directions in plan view.

5. The semiconductor device according to claim 1, wherein the first lower conductor or the second lower conductor is uneven in thickness.

6. The semiconductor device according to claim 1, wherein solder for joining the any of the plurality of semiconductor chips and the lower main body is provided so that a contact area of the solder with the semiconductor chip is larger than a contact area of the solder with the lower main body, and solder for joining the semiconductor chip and the second lower conductor is provided so that a contact area of the solder with the semiconductor chip is larger than a contact area of the solder with the second lower conductor.

7. The semiconductor device according to claim 1, wherein the lower main body, the insulating plate and the upper conductor are absent just above a part of solder for joining the any of the plurality of semiconductor chips and the lower main body.

8. The semiconductor device according to claim 1, wherein the second lower conductor, the insulating plate and the upper conductor are absent just above a part of solder for joining the any of the plurality of semiconductor chips and the second lower conductor.

9. The semiconductor device according to claim 1, wherein the connection portion is formed by performing pressure welding on a metal member.

10. The semiconductor device according to claim 9, wherein the metal member is provided so as not to be filled in the through-hole, filling metal that is in contact with the metal member and filled in the through-hole is provided, and the filling metal protrudes in a direction toward the semiconductor chip.

11. The semiconductor device according to claim 1, further comprising resin that covers the insulating plate, the first lower conductor, the second lower conductor, the upper conductor, and the plurality of semiconductor chips, and exposes parts of the first external electrode and the second external electrode to an outside, wherein the insulating plate is provided with a filling hole filled with the resin.

12. The semiconductor device according to claim 1, further comprising an active part that is electrically connected to the upper main body.

13. The semiconductor device according to claim 1, wherein a plurality of pairs each of which includes the first lower conductor and the first external electrode are provided, and a plurality of the first external electrodes are formed of different materials.

14. The semiconductor device according to claim 1, wherein the first external electrode and the second external electrode are formed of different materials.

15. The semiconductor device according to claim 1, wherein the first external electrode is thicker than the first lower conductor, and the second external electrode is thicker than the upper conductor.

16. The semiconductor device according to claim 1, further comprising resin that covers the insulating plate, the first lower conductor, the second lower conductor, the upper conductor and the plurality of semiconductor chips, and exposes parts of the first external electrode and the second external electrode to an outside, wherein the resin is exposed at a side surface.

* * * * *